United States Patent
Jain et al.

(10) Patent No.: US 10,657,307 B1
(45) Date of Patent: May 19, 2020

(54) USING RUNTIME INFORMATION FROM SOLVERS TO MEASURE QUALITY OF FORMAL VERIFICATION

(71) Applicant: Synopsys, Inc., Mountain View, CA (US)

(72) Inventors: Himanshu Jain, Hillsboro, OR (US); Per M. Bjesse, Portland, OR (US); Pratik Mahajan, Cupertino, CA (US)

(73) Assignee: Synopsys, Inc., Mountain View, CA (US)

(*) Notice: Subject to any disclaimer, the term of this patent is extended or adjusted under 35 U.S.C. 154(b) by 35 days.

(21) Appl. No.: 16/023,849

(22) Filed: Jun. 29, 2018

Related U.S. Application Data

(60) Provisional application No. 62/526,482, filed on Jun. 29, 2017.

(51) Int. Cl.
*G06F 30/00* (2020.01)
*G06F 30/3323* (2020.01)
*G06F 30/30* (2020.01)

(52) U.S. Cl.
CPC .......... *G06F 30/3323* (2020.01); *G06F 30/30* (2020.01)

(58) Field of Classification Search
CPC ........................... G06F 17/504; G06F 17/5045
See application file for complete search history.

(56) References Cited

U.S. PATENT DOCUMENTS

| | | | | |
|---|---|---|---|---|
| 6,484,134 B1* | 11/2002 | Hoskote | ........... | G01R 31/31835 703/14 |
| 6,848,088 B1* | 1/2005 | Levitt | ................... | G06F 17/504 716/106 |
| 7,865,339 B2* | 1/2011 | Rushby | ............... | G06F 11/3684 703/2 |
| 7,895,552 B1* | 2/2011 | Singhal | ................. | G06F 17/504 716/106 |
| 8,826,201 B1* | 9/2014 | Hanna | ................. | G06F 17/5045 716/104 |
| 8,881,075 B2* | 11/2014 | Lu | ....................... | G06F 17/5022 703/2 |
| 9,021,409 B2* | 4/2015 | Vasudevan | ........... | G06F 17/504 716/106 |
| 9,158,876 B2 | 10/2015 | Ranjan et al. | | |
| 9,177,089 B2* | 11/2015 | Hanna | ................. | G06F 17/5045 |

(Continued)

OTHER PUBLICATIONS

Sia Karthik Madabhushi, "Formal-based Coverage-Driven Verification", Jasper Design Automation, May 15, 2014.

*Primary Examiner* — Naum Levin
(74) *Attorney, Agent, or Firm* — Park, Vaughan, Fleming & Dowler LLP; Laxman Sahasrabuddhe

(57) ABSTRACT

Systems and techniques are described for using runtime information to identify a verification hole and/or compute a verification metric. Runtime information (RI) for a set of proven assertions can be determined, wherein the RI includes a first set of registers, a first set of inputs, and a first set of constraints that were used by a formal verification engine during runtime to prove one or more assertions for a design under verification (DUV). Next, a second set of registers, a second set of inputs, and a second set of constraints that are not present in the RI can be determined. The second set of registers, the second set of inputs, and/or the second set of constraints can then be used to (1) identify a verification hole and/or (2) compute a verification metric.

15 Claims, 3 Drawing Sheets

Determine runtime information (RI) for a set of proven assertions for a DUV, wherein the RI includes a first set of registers, a first set of inputs, and a first set of constraints that were used by a formal verification engine during runtime to prove one or more assertions in the set of proven assertions — 202

Determine a second set of registers, a second set of inputs, and a second set of constraints that are not present in the RI — 204

Use the second set of registers, the second set of inputs, and/or the second set of constraints to (1) identify a verification hole and/or (2) compute a verification metric — 206

(56) References Cited

U.S. PATENT DOCUMENTS

| | | | | |
|---|---|---|---|---|
| 9,355,206 B2* | 5/2016 | Ikram | ............... | G06F 17/5045 |
| 2013/0318486 A1* | 11/2013 | Sasaki | ............... | G06F 17/5045 |
| | | | | 716/106 |

* cited by examiner

GUI window 322

Lines covered by FV

Lines not covered by FV

USING RUNTIME INFORMATION FROM SOLVERS TO MEASURE QUALITY OF FORMAL VERIFICATION

RELATED APPLICATION

This application claims benefit of U.S. Provisional Application Ser. No. 62/526,482, filed on 29 Jun. 2017, by the same inventors, the contents of which are herein incorporated by reference in their entirety for all purposes.

BACKGROUND

Technical Field

This disclosure relates to formal verification. More specifically, this disclosure relates to using runtime information from solvers to measure quality of formal verification.

Related Art

Advances in process technology and an almost unlimited appetite for electronics have fueled a rapid increase in the size and complexity of integrated circuit (IC) designs. The importance of testing in IC designs cannot be over-emphasized. It is very important to guarantee that certain circuits in an IC design will operate correctly. Indeed, it would be impossible to use IC designs in mission-critical devices and applications if IC designs had not been thoroughly tested.

One approach for verifying an IC design involves simulating the IC design. However, this approach cannot provide any guarantees regarding the behavior of the IC design because it is computationally infeasible (and often impossible) to exhaustively simulate non-trivial IC designs. Another approach is to use formal verification to prove that the IC design will operate correctly. Unfortunately, existing techniques do not provide information about the quality of formal verification.

For example, in a research paper entitled "Efficient Computation of Observability-Based Code Coverage Metrics for Functional Verification," by Farzan Fallah, Member, IEEE, Srinivas Devadas, Fellow, IEEE, and Kurt Keutzer, Fellow, IEEE TCAD 2001, the authors describe a way to compute observability based code coverage by modifying control flow graph extracted from RTL. However, this paper relates to simulation based verification. As explained above, simulation and formal verification techniques are completely different approaches. Specifically, in formal verification, there is no notion of a test suite, because formal verification considers all possible inputs. The metrics described in the above-mentioned paper by Fallah, et al. are not applicable to formal verification approaches.

Another research paper entitled "Coverage Metrics for Formal Verification," by Chockler H., Kupferman O., Vardi M. Y. (2003), uses design mutations to generate coverage metrics. The techniques presented in the research paper are very expensive to apply in practice. A typical register transfer level (RTL) design will have thousands of lines of RTL code and millions of coverage checks. Introducing mutations to check coverage will be very expensive because each check itself is another property that needs to be checked by using a model checker (formal verification tool). Also, the above-mentioned research paper by Chockler et. al. does not present any experimental results.

In a research paper entitled "Coverage Metrics for Functional Validation of Hardware Designs," by S. Tasiran and K. Keutzer, the authors present a survey of the various coverage metrics used in simulation based verification and discusses pros/cons of different coverage metrics. However, the research paper does not disclose any coverage metrics for formal verification.

Hence, what are needed are techniques and systems to measure the quality of formal verification.

SUMMARY

Some embodiments described herein provide techniques and systems for using runtime information to identify a verification hole and/or compute a verification metric. During operation, some embodiments can determine runtime information (RI) for a set of proven assertions, wherein the RI includes a first set of registers, a first set of inputs, and a first set of constraints that were used by a formal verification engine during runtime to prove one or more assertions for a design under verification (DUV). Next, a second set of registers, a second set of inputs, and a second set of constraints that are not present in the RI can be determined. The second set of registers, the second set of inputs, and/or the second set of constraints can then be used to (1) identify a verification hole and/or (2) compute a verification metric. In some embodiments, a visual indicator can be generated to convey information about a verification hole or a verification metric. Next, the visual indicator can be displayed on a graphical user interface (GUI) of the computer.

In some embodiments, using the second set of registers, the second set of inputs, and/or the second set of constraints to (1) identify the verification hole and/or (2) compute the verification metric comprises computing a ratio of a count of registers in the second set of registers and a total count of registers in the DUV.

In some embodiments, using the second set of registers, the second set of inputs, and/or the second set of constraints to (1) identify the verification hole and/or (2) compute the verification metric comprises computing a ratio of a count of inputs in the second set of inputs and a total count of inputs in the DUV.

In some embodiments, using the second set of registers, the second set of inputs, and/or the second set of constraints to (1) identify the verification hole and/or (2) compute the verification metric comprises computing a ratio of a count of constraints in the second set of constraints and a total count of constraints.

DETAILED DESCRIPTION

Figure 1A:
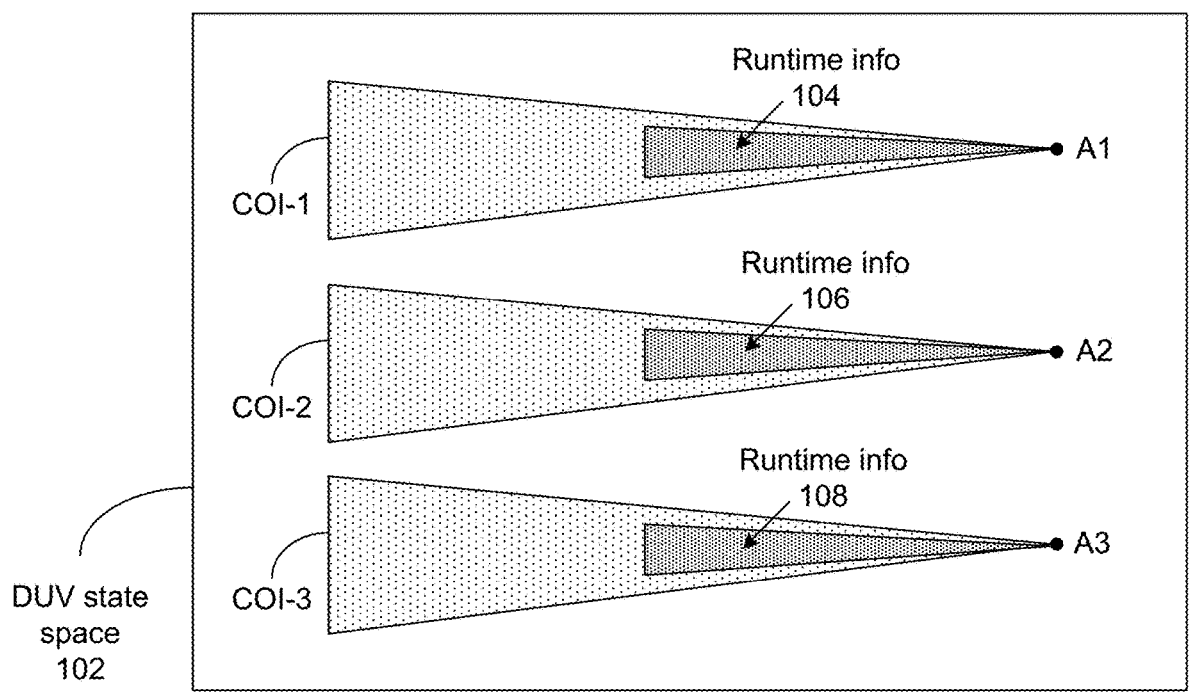
FIGS. 1A-1B illustrate how runtime information can be used to accurately identify formal verification holes in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of IC Design and Manufacturing

An IC design and manufacturing process produces IC chips. Specifically, IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results (QoR).

An IC design can be represented by using different data formats or languages as the IC design progresses through an IC design flow, wherein the different data formats or languages represent the IC design at different levels of abstraction. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (the description of the IC design becomes more specific as the IC design progresses through the IC design flow). For example, toward the beginning of the IC design flow, an IC design can be described at a high level of abstraction by using a hardware description language (HDL) which describes the functionality of the IC design but does not provide any information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between the two ends of the IC design flow, the IC design may be represented in numerous data formats or languages that describe the same IC design at different levels of abstraction. Some examples of IC design steps and the associated software tools are described below. These examples are for illustrative purposes only and are not intended to limit the embodiments to the forms disclosed.

Some IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. Some embodiments described herein can be used in this stage, i.e., during synthesis and design for test. During netlist verification, the netlist can be checked for compliance with timing constraints and for correspondence (i.e., equivalence checking) with the RTL design and/or HDL code. If the netlist is functionally equivalent to the RTL design, then the netlist can be provided to the next step in the IC design and manufacturing process. Otherwise, any discrepancies between the netlist and the RTL design can be identified and fixed before proceeding to the next step.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Measuring Quality of Formal Verification

Some embodiments described herein relate to measuring quality of formal verification (FV). The goal of FV is to check that a given design satisfies a certain set of behaviors under a given set of constraints. An FV tool can either prove that a given property about the design holds for all possible legal inputs or it can produce a counterexample (trace) showing how the specified property can fail. A third outcome is that FV tool is not able to conclusively determine whether the property holds or fails within the given resource limits. To perform FV, a formal test bench around the DUV may be created. The behaviors to check for a given formal test bench are called assertions. The behaviors which are assumed to be true are called assumptions (constraints). For example, when verifying a FIFO design an assertion can check that FIFO never over-flows.

In other words, a DUV can be modeled by using a finite-state transition system that is defined over a set of internal state variables. Each state of the DUV corresponds to a particular assignment of Boolean values to the set of internal state variables. Assertions and assumptions are formulas that are defined over the internal state variables of the DUV. The formal verification engine tries to prove that the assertions are true whenever the assumptions are true.

One of the challenges in existing FV tools is that there is no quantitative way of knowing when we are done so that we can confidently signoff a block verified through formal verification. Specifically, existing FV approaches suffer from the following drawbacks (each question shown below relates to a drawback):

Have I written enough assertions? In existing FV tools, we don't know whether we have written enough assertions to check all possible design behaviors. If certain parts of the design are not formally verified, then there may be bugs in those parts of the design.

Have I over-constrained my FV setup? In existing FV tools, we don't know if we have over-constrained the design. Over-constraining means that we have disallowed certain legal behaviors when performing FV. Thus, we may miss bugs even though we get proofs for all the properties.

Coverage metrics to measure progress of FV? In existing FV tools, we don't know the coverage of our formal verification. Design and verification teams using simulation rely on coverage metrics such as line coverage to monitor the verification progress on a daily/weekly/monthly basis. This allows data-driven decision making on whether verification is done or not. However, such coverage data is not available for FV.

Signoff based on bounded proofs? In industrial applications of FV, a common scenario is that certain assertions about the design do not converge (we do not get proof or a failure). In such cases we only know the number of clock cycles (bounded depth) up to which the property is known to be true. In such cases a key question whether the bounded depths achieved good enough to sign-off.

Some embodiments described herein allow us to determine what parts of the design and formal test bench were exercised by the formal verification engine(s) at runtime. This runtime information allows us to quantitatively identify holes in formal verification. We can accurately track which registers, inputs, and assumptions that were used by the formal verification engines to perform the proofs or bounded proofs. By complementing this information, we can identify which parts of the design and formal test bench that were not exercised (not checked during FV). More precisely, our invention tells us which registers, inputs, and constraints played no role in formal verification. We refer to these as verification holes (FV holes). We can further lift this information to compute coverage metrics such as line converge to indicate what parts of the source code played no role in formal verification.

The existing approach to measure quality of FV relies on looking at structural cone-of-influence (COI) to see if the given set of assertions cover the entire design. However, this approach is based on static information and can be very optimistic, leading to false confidence in the quality of formal verification. Embodiments described in this disclosure use the runtime information from formal verification engines to accurately track what parts of the design were used when proving a property. The runtime information is a subset of static COI based approach and more accurate in identifying verification holes.

Figure 1B:
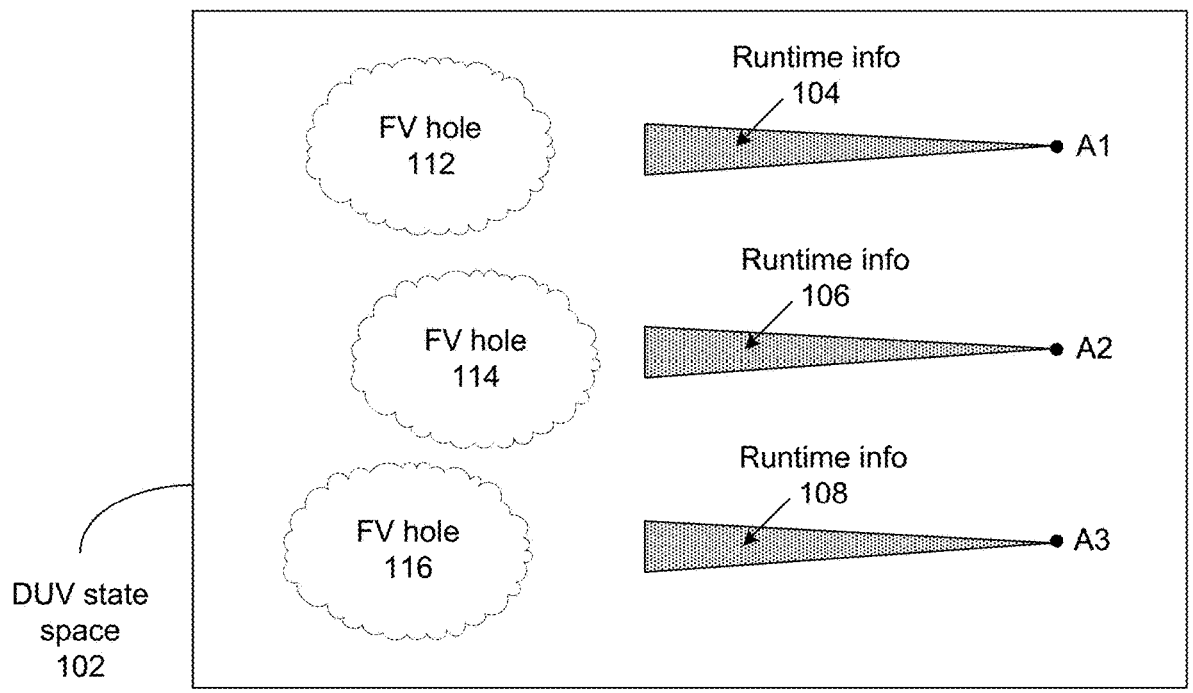

FIGS. 1A-1B illustrate how runtime information can be used to accurately identify formal verification holes in accordance with some embodiments described herein. DUV state space 102 includes cone of influences COI-1, COI-2, and COI-3 (lightly shaded triangles) correspond to assertions A1, A2, and A3, respectively. COI-1, COI-2, and COI-3 are determined statically. During runtime (i.e., when the formal verification tool is actually trying to prove the assertions A1, A2, and A3), only a portion of COI-1, COI-2, and COI-3 may actually be verified. The portions of the COIs that are actually verified by the formal verification engine are illustrated in FIG. 1A as "runtime info 104," "runtime info 106," and "runtime info 108" (darkly shaded triangles).

The FV holes correspond to regions that are outside the portions of the COIs that are verified during runtime. For example, as shown in FIG. 1B, FV holes 112, 114, and 116 can be identified based on "runtime info 104," "runtime info 106," and "runtime info 108."

Given an assertion, a formal engine determines if that assertion is true, or false, or undecided (with the given resources). When performing FV multiple engines may execute in parallel to check the same set of assertions. Some examples of such engines include Bounded Model Checking (BMC), Induction, Property Directed Reachability (PDR). Once an engine has determined that a property (i.e., assertion) is either true or false, all other engines working on the same assertion can be killed (if running in parallel).

Some embodiments described in this disclosure extract from each formal verification engine the registers, inputs, constraints (assumptions) that the formal verification engine used during the proof. We refer to the set of registers/inputs/constraints that were used by an engine during the proof as the runtime information (RI) for a given property. Some embodiments can minimize RI so that we are left with a minimal set of registers/inputs/constraints required for proving an assertion by a given engine.

Once the RI for each property has been computed we take the union of RI for all the proven assertions giving us three sets: registers used in RI of some property (FC_REGS), inputs used in RI of some property (FC_INPS), constraints used in RI of some property (FC_CONS), respectively. Next we compute the complement of these sets to generate set of registers (COMP_REGS), inputs (COMP_INPS), constraints (COMP_CONS) that are not used in RI of any of the properties. Next we show how we can use this information to solve the problems mentioned in the previous sections.

Figure 2:
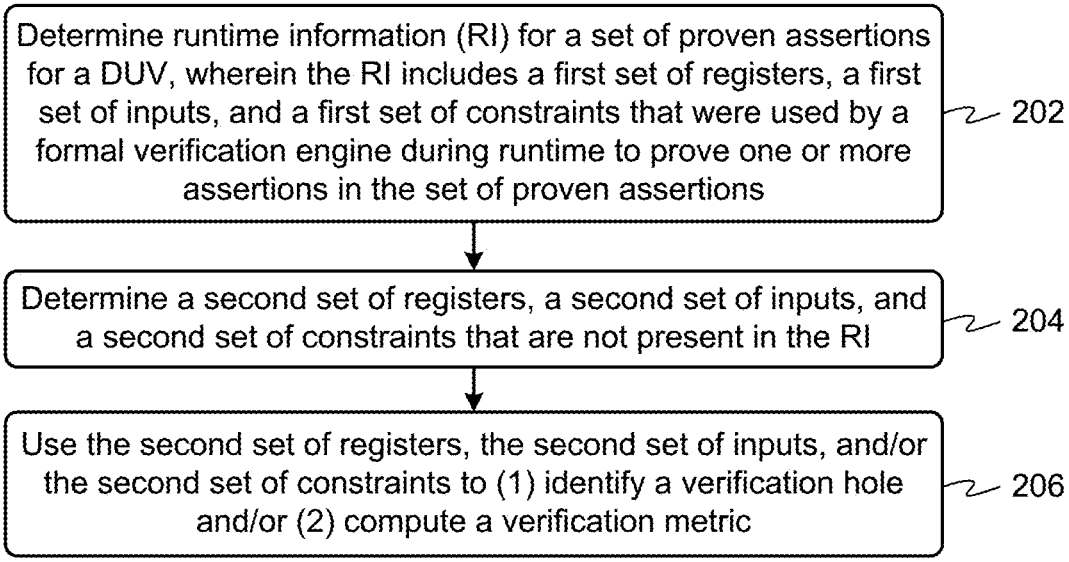
FIG. 2 illustrates a process for using runtime information to identify a verification hole and/or compute a verification metric in accordance with some embodiments described herein.

FIG. 2 illustrates a process for using runtime information to identify a verification hole and/or compute a verification metric in accordance with some embodiments described herein. Specifically, the process can begin by determining RI for a set of proven assertions for a DUV, wherein the RI includes a first set of registers, a first set of inputs, and a first set of constraints that were used by a formal verification engine during runtime to prove one or more assertions in the set of proven assertions (step 202). Next, the process can determine a second set of registers, a second set of inputs, and a second set of constraints that are not present in the RI (step 204). The process can then use the second set of registers, the second set of inputs, and/or the second set of constraints to (1) identify a verification hole and/or (2) compute a verification metric (step 206). In some embodiments, a visual indicator can be generated to convey information about a verification hole or a verification metric. Next, the visual indicator can be displayed on a GUI of a computer.

Some examples of how the second set of registers, the second set of inputs, and/or the second set of constraints can be used to (1) identify a verification hole and/or (2) compute a verification quality metric are now discussed.

An answer can be provided to the question "have I written enough assertions?" as follows. If COMP_REGS is not empty, then it means we have not formally checked functionality of some registers. This points to missing assertions or over-constraints. A report can be generated that identifies the missing assertions or over-constraints, and the report can be provided to user via a graphical user interface (GUI). The users can then decide to add more assertions and/or revise existing assertions/constraints.

An answer can be provided to the question "have I over-constrained my FV setup?" as follows. If COMP_CONS is not empty, then it means that constraints present in COMP_CONS are not needed in proving any property. These constraints can consist of over-constraints or unnecessary constraints. A report can be generated that identifies the over-constraints or unnecessary constraints, and the report can be provided to user via a GUI. The user can decide to remove/rewrite these constraints.

Figure 3A:
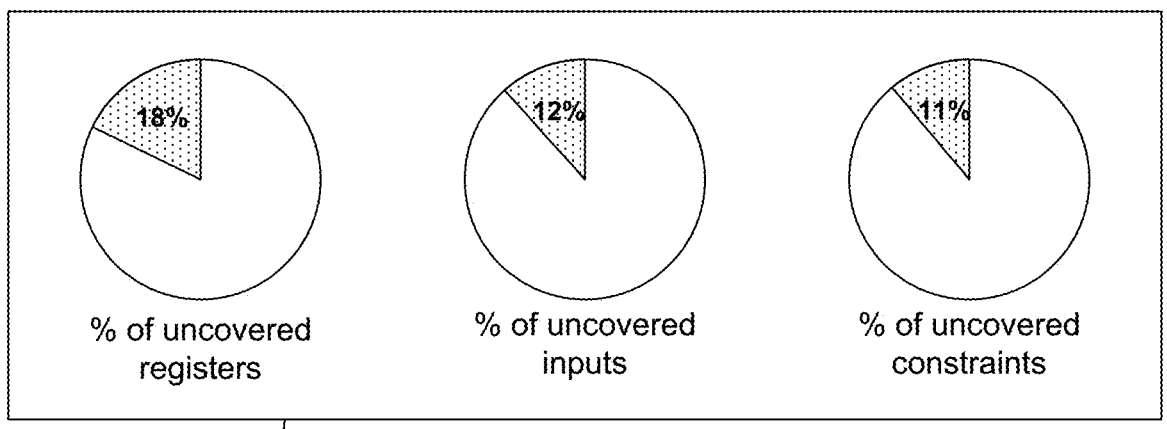
FIG. 3A illustrates an example of a verification metric in accordance with some embodiments described herein.

Verification metrics can be determined to measure progress of FV. The ratio of FC_REGS to total registers provides a quantitative metric that can be tracked to measure progress of formal verification. This metric (and similar metrics for inputs and constraints) can be tracked on a regular basis to assess the quality of formal verification. FIG. 3A illustrates an example of a verification metric in accordance with some embodiments described herein. A visual indicator can be generated based on the computed verification metric, and the visual indicator can be displayed to a user via a GUI. For example, visual indicator 302 (a set of pie-charts) can be generated and displayed to indicate that 18% registers, 12% inputs and 6% constraints are not covered, that is, not present in RI of any proven property. This means that formal verification is not complete yet.

Coverage metrics can be determined to measure progress of FV. To compute lines of the code covered by formal proofs, some embodiments can perform structural traversal on a word-level netlist by treating signals appearing in the property as roots. Unlike full cone-of-influence (COI), the process can stop along a path as soon as we encounter a register that is outside FC_REGS. The process can maintain a source correspondence between the elements in word-level netlist to RTL file/line number. For each element present in the structural traversal the process can mark the corresponding RTL line as covered and generate a coverage database. Coverage database is very familiar to anyone using simulation based signoff. The coverage database generated from formal verification can be visualized and manipulated in a similar fashion as a regular simulation coverage database. Furthermore, for the blocks that are completely verified by the formal verification engine, the project manager can decide to merge formal generated coverage database with simulation coverage database.

Figures 3B, 4:
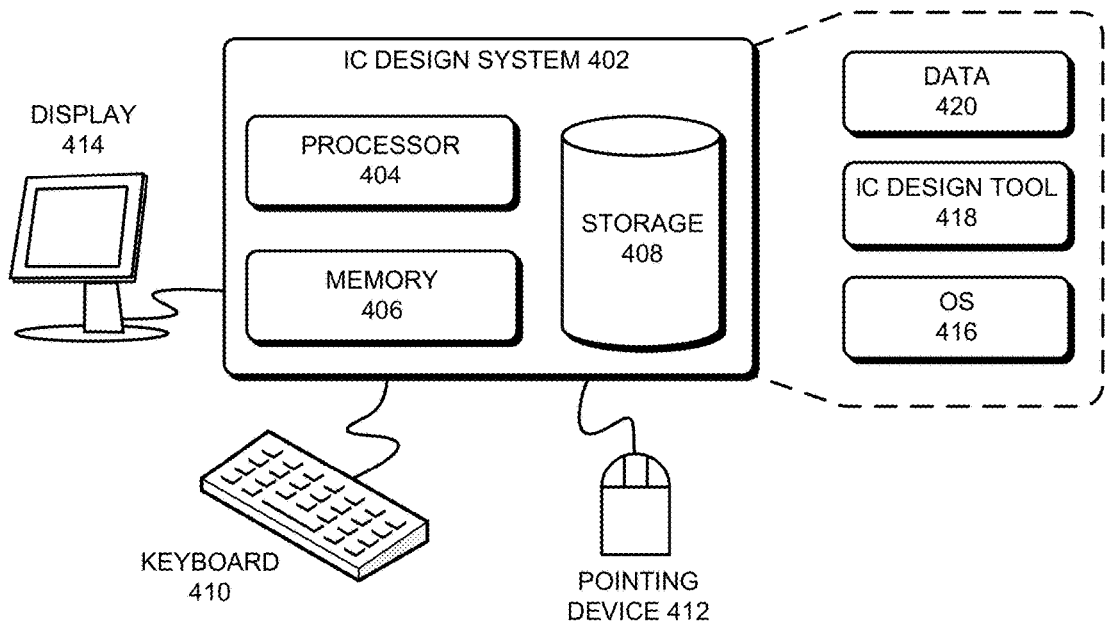
FIG. 3B illustrates an example of a coverage metric in accordance with some embodiments described herein.
FIG. 4 illustrates an IC design system in accordance with some embodiments described herein.

FIG. 3B illustrates an example of a coverage metric in accordance with some embodiments described herein. Lines 29-46 of code for an IC design are illustrated in a GUI window 322. FIG. 3B illustrates how the runtime information from engines can be shown at the RTL level in form of line coverage. Some embodiments can use the RI to determine that lines 29-34 were covered by the formal verification engine, i.e., these lines are present in the RI of at least one proven assertion. These lines can be highlighted using a first color (e.g., green) to easily convey this information to the user. Lines 37-46 can be highlighted using a second color (e.g., red) to convey that lines 37-46 were not present in RI of any assertion, i.e., the lines in the second color means that those lines have played no role in FV.

Note that, just like any coverage metric, a line that is "covered" is not a guarantee that there is no bug in those parts of the design. However, a 100% coverage is a measurable criterion which is used routinely as a signoff-criteria. If 100% coverage is reached, and the user wants to increase the amount of formal verification that is performed on the IC design, then the user can decide to add more assertions and/or remove constraints to find more bugs.

In some embodiments, for each property where we only have a bounded proof up to some number of clock cycles, we can compute the runtime information up to those bounded depths. The embodiments can then take the union of RI for all proven and bounded proven properties to determine what parts of the IC design, the formal test bench, and the constraints are not used.

IC Design System

The term "IC design system" generally refers to a hardware-based system that facilitates the design and manufacture of ICs. FIG. 4 illustrates an IC design system in accordance with some embodiments described herein. IC design system 402 can include processor 404, memory 406, and storage device 408. Specifically, memory locations in memory 406 can be addressable by processor 404, thereby enabling processor 404 to access (e.g., via load/store instructions) and manipulate (e.g., via logical/floating point/arithmetic instructions) the data stored in memory 406. IC design system 402 can be coupled to display device 414, keyboard 410, and pointing device 412. Storage device 408 can store operating system 416, IC design tool 418, and data 620. Data 620 can include input required by IC design tool 418 and/or output generated by IC design tool 418.

IC design system 402 may automatically (or with user help) perform one or more operations that are implicitly or explicitly described in this disclosure. Specifically, IC design system 402 can load IC design tool 418 into memory 406, and IC design tool 418 can then be used to produce a synthesized IC design, wherein the IC design tool 418 can perform equivalence checking between a netlist and an RTL design while producing the synthesized IC design. When the synthesized IC design is manufactured, the resulting IC chips contain the synthesized IC design which was formally verified using techniques and systems described herein.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions that, when executed by a computer, cause the computer to perform a method for using runtime information to identify a verification hole and/or compute a verification metric, the method comprising:
attempting to prove a set of assertions for a design under verification (DUV) by executing multiple formal verification engines in parallel, wherein each assertion in the set of assertions is attempted to be proven by multiple formal verification engines in parallel, and wherein after a given formal verification engine proves a given assertion, formal verification engines other than the given formal verification engine are stopped from proving the given assertion;
for each proven assertion in a set of proven assertions, extracting runtime information (RI) for the proven assertion from a respective formal verification engine that proved the proven assertion, wherein each RI corresponding to each proven assertion includes registers, inputs, and constraints that were used by the respective formal verification engine to prove the proven assertion;
determining a set of registers, a set of inputs, and a set of constraints that are not present in a union of RI extracted from the respective formal verification engine for each proven assertion in the set of proven assertions; and
using the set of registers, the set of inputs, and/or the set of constraints to (1) identify a verification hole and/or (2) compute a verification metric.

2. The non-transitory computer-readable storage medium of claim 1, wherein said using the set of registers, the set of inputs, and/or the set of constraints to (1) identify the verification hole and/or (2) compute the verification metric comprises computing a ratio of a count of registers in the set of registers and a total count of registers in the DUV.

3. The non-transitory computer-readable storage medium of claim 1, wherein said using the set of registers, the set of inputs, and/or the set of constraints to (1) identify the verification hole and/or (2) compute the verification metric comprises computing a ratio of a count of inputs in the set of inputs and a total count of inputs in the DUV.

4. The non-transitory computer-readable storage medium of claim 1, wherein said using the set of registers, the set of inputs, and/or the set of constraints to (1) identify the verification hole and/or (2) compute the verification metric comprises computing a ratio of a count of constraints in the set of constraints and a total count of constraints.

5. The non-transitory computer-readable storage medium of claim 1, wherein the method further comprises:
generating a visual indicator to convey information about a verification hole or a verification metric; and
displaying the visual indicator on a graphical user interface (GUI) of the computer.

6. An apparatus, comprising:
a processor;
a display; and
a non-transitory computer-readable storage medium storing instructions that, when executed by the processor, cause the processor to perform a method for using runtime information to identify a verification hole and/or compute a verification metric, the method comprising:
attempting to prove a set of assertions for a design under verification (DUV) by executing multiple formal verification engines in parallel, wherein each assertion in the set of assertions is attempted to be proven by multiple formal verification engines in parallel, and wherein after a given formal verification engine proves a given assertion, formal verification engines other than the given formal verification engine are stopped from proving the given assertion;
for each proven assertion in a set of proven assertions, extracting runtime information (RI) for the proven assertion from a respective formal verification engine that proved the proven assertion, wherein each RI corresponding to each proven assertion includes registers, inputs, and constraints that were used by the respective formal verification engine to prove the proven assertion;
determining a set of registers, a set of inputs, and a set of constraints that are not present in a union of RI extracted from the respective formal verification engine for each proven assertion in the set of proven assertions; and
using the set of registers, the set of inputs, and/or the set of constraints to (1) identify a verification hole and/or (2) compute a verification metric.

7. The apparatus of claim 6, wherein said using the set of registers, the set of inputs, and/or the set of constraints to (1) identify the verification hole and/or (2) compute the verification metric comprises computing a ratio of a count of registers in the set of registers and a total count of registers in the DUV.

8. The apparatus of claim 6, wherein said using the set of registers, the set of inputs, and/or the set of constraints to (1) identify the verification hole and/or (2) compute the verification metric comprises computing a ratio of a count of inputs in the set of inputs and a total count of inputs in the DUV.

9. The apparatus of claim 6, wherein said using the set of registers, the set of inputs, and/or the set of constraints to (1) identify the verification hole and/or (2) compute the verification metric comprises computing a ratio of a count of constraints in the set of constraints and a total count of constraints.

10. The apparatus of claim 9, wherein the method performed by the processor further comprises:
generating a visual indicator to convey information about a verification hole or a verification metric; and
displaying the visual indicator in the display.

11. A method for using runtime information to identify a verification hole and/or compute a verification metric, the method comprising:
attempting to prove a set of assertions for a design under verification (DUV) by executing multiple formal verification engines in parallel, wherein each assertion in the set of assertions is attempted to be proven by multiple formal verification engines in parallel, and wherein after a given formal verification engine proves a given assertion, formal verification engines other than the given formal verification engine are stopped from proving the given assertion;
for each proven assertion in a set of proven assertions, extracting runtime information (RI) for the proven assertion from a respective formal verification engine that proved the proven assertion, wherein each RI corresponding to each proven assertion includes registers, inputs, and constraints that were used by the respective formal verification engine to prove the proven assertion;

determining a set of registers, a set of inputs, and a set of constraints that are not present in a union of RI extracted from the respective formal verification engine for each proven assertion in the set of proven assertions; and using the set of registers, the set of inputs, and/or the set of constraints to (1) identify a verification hole and/or (2) compute a verification metric.

12. The method of claim 11, wherein said using the set of registers, the set of inputs, and/or the set of constraints to (1) identify the verification hole and/or (2) compute the verification metric comprises computing a ratio of a count of registers in the set of registers and a total count of registers in the DUV.

13. The method of claim 11, wherein said using the set of registers, the set of inputs, and/or the set of constraints to (1) identify the verification hole and/or (2) compute the verification metric comprises computing a ratio of a count of inputs in the set of inputs and a total count of inputs in the DUV.

14. The method of claim 11, wherein said using the set of registers, the set of inputs, and/or the set of constraints to (1) identify the verification hole and/or (2) compute the verification metric comprises computing a ratio of a count of constraints in the set of constraints and a total count of constraints.

15. The method of claim 14, wherein the method further comprises:

generating a visual indicator to convey information about a verification hole or a verification metric; and displaying the visual indicator on a graphical user interface (GUI) of the computer.

* * * * *